United States Patent
Roux et al.

(10) Patent No.: US 10,585,402 B2
(45) Date of Patent: Mar. 10, 2020

(54) METHOD OF CONSTRUCTING A REFERENCE DATA STRUCTURE AND METHOD OF CONTROLLING AN ACTUATOR

(71) Applicant: SOMFY SAS, Cluses (FR)

(72) Inventors: Morgan Roux, Passy (FR); Serge Neuman, Seynod (FR); Thierry Beaujeu, Marignier (FR)

(73) Assignee: SOMFY SAS, Cluses (FR)

( * ) Notice: Subject to any disclaimer, the term of this patent is extended or adjusted under 35 U.S.C. 154(b) by 879 days.

(21) Appl. No.: 14/356,016

(22) PCT Filed: Nov. 7, 2012

(86) PCT No.: PCT/EP2012/072030
§ 371 (c)(1),
(2) Date: May 2, 2014

(87) PCT Pub. No.: WO2013/068400
PCT Pub. Date: May 16, 2013

(65) Prior Publication Data
US 2014/0316580 A1    Oct. 23, 2014

(30) Foreign Application Priority Data

Nov. 7, 2011  (FR) ...................................... 11 60133
Apr. 12, 2012 (FR) ...................................... 12 53396

(51) Int. Cl.
*G05B 11/01* (2006.01)
*G06F 17/50* (2006.01)
(Continued)

(52) U.S. Cl.
CPC .............. *G05B 11/01* (2013.01); *E06B 9/68* (2013.01); *G05B 15/02* (2013.01); *G06F 17/50* (2013.01);
(Continued)

(58) Field of Classification Search
CPC ..................................................... G05B 11/01
(Continued)

(56) References Cited

U.S. PATENT DOCUMENTS 6,064,949 A * 5/2000 Werner .................. G05D 27/02
250/214 AL
2004/0205450 A1* 10/2004 Hao ....................... G06T 11/206
715/277
(Continued)

FOREIGN PATENT DOCUMENTS

DE        102005032550 A1    1/2007

OTHER PUBLICATIONS

International Search Report dated Apr. 12, 2013; re: PCT/EP2012/072030; citing: DE 10 2005 032550 A1 and NETxAutomation Software GmbH.
(Continued)

*Primary Examiner* — James D. Rutten
(74) *Attorney, Agent, or Firm* — Cantor Colburn LLP

(57) ABSTRACT

Method of constructing a reference data structure and method of controlling an actuator. The present invention is aimed at a method of constructing a reference data structure (DR) comprising at least one setpoint parameter (PAR) for at least one actuator (12) of an item of equipment of a building-automation installation, comprising a step (S30) of generating the reference data structure (DR) comprising an association set ({CVE1*j*; VPi}) for associating between at least one determined value (VPi) corresponding to the at least one setpoint parameter and the determined combination (CVE1*j*) belonging to the set (E1) of functional data (CVE1) and a method of controlling at least one actuator (12) of an item of equipment of a building-automation installation, the method being implemented by the actuator (12) or by a controller (11) associated with said actuator (12) and com-
(Continued)

prising a step (E30) of controlling the at least one actuator (12) by applying a setpoint (Cs) determined as a function of the at least one setpoint parameter value (VP) selected in the reference data structure (DR) as well as a system comprising at least one computer (20) and at least one actuator (12) for the respective implementation of said methods.

17 Claims, 7 Drawing Sheets

(51) Int. Cl.
    *E06B 9/68*     (2006.01)
    *G05B 15/02*     (2006.01)

(52) U.S. Cl.
    CPC ............ *E06B 2009/6818* (2013.01); *G05B 2219/163* (2013.01); *G05B 2219/25011* (2013.01); *G05B 2219/2642* (2013.01)

(58) Field of Classification Search
    USPC .......................................................... 700/275
    See application file for complete search history.

(56) References Cited

U.S. PATENT DOCUMENTS

| | | | |
|---|---|---|---|
| 2005/0131554 A1* | 6/2005 | Bamberger | E06B 9/32 700/19 |
| 2006/0207730 A1* | 9/2006 | Berman | E06B 9/32 160/310 |
| 2009/0093916 A1* | 4/2009 | Parsonnet | F24F 5/0017 700/286 |
| 2011/0251720 A1* | 10/2011 | Neuman | E06B 9/32 700/275 |
| 2014/0118350 A1* | 5/2014 | Imhof | G01V 1/325 345/424 |

OTHER PUBLICATIONS

NETxAutomation Software GmbH: "NETxAutomation Software GmbH for your innovative and reliable Bulilding Automation Solution", Product Brochure May 7, 2010, XP002693230; URL:http://www2.solar.dk/download/nextautomation_produktoverblik.pdf.

* cited by examiner

METHOD OF CONSTRUCTING A REFERENCE DATA STRUCTURE AND METHOD OF CONTROLLING AN ACTUATOR

The present invention relates to the field of building automation.

More particularly, the present invention relates to a method of constituting a reference data structure comprising at least one setpoint parameter of at least one actuator of an equipment of a building automation installation and a method of controlling such an actuator.

The present invention also relates to a system comprising a computer and an actuator arranged to implement such methods.

It is known to have a building automation installation comprising a plurality of actuators of electric equipment whereof the control laws may be determined by an internal program and conditioned to measurements performed by sensors associated with these actuators.

However, such a system requires computing resources from the actuators and requires an on-site reprogramming of each actuator in case of change in the environment in which the building automation installation is installed.

The present invention aims to resolve all or part of the aforementioned drawbacks, particularly by automatically controlling the electrical equipment that is part of a building automation installation (locking, shading, lighting, heating, ventilation, alarms, etc.)

To this end, the present invention relates to a method of constituting a reference data structure comprising at least one setpoint parameter of at least one actuator of an equipment of a building automation installation, comprising:
- a step of determining a set of at least one combination of values of quantities measurable by at least one sensor associated with the actuator, called set of functional data;
- a step of determining, for at least one determined combination belonging to the set of functional data, at least one value corresponding to at least one setpoint parameter, according to the determined combination,
- a step of generating the reference data structure comprising a set of association between at least one determined value corresponding to at least one setpoint parameter and the determined combination belonging to the set of functional data.

This arrangement allows gathering in a reference data structure, the set of values of the setpoint parameters able to be used in an installation of electrical equipment, and particularly of actuators.

According to one embodiment, the method of constitution further comprises a step of determining a set of configuration data of the building automation installation, and wherein determining at least one value corresponding to at least one setpoint parameter, is also performed based on the configuration data of the set of configuration data of the building automation installation.

This arrangement allows adjusting the setpoint parameter values as accurately as possible with respect to configuration data which can go as far as including the weather forecast.

According to one implementation of the method of constitution, the step of generating comprises a sub step of digitally encoding the reference data structure, compatible with a representation in the form of an image comprising a set of pixels, each pixel of the image being defined by a positioning and at least one component,
the positioning of a pixel in the image being determined as a function of the values of measurable quantities in said different combinations of the set of functional data, and
at least one component of a pixel of at least one image corresponding to the setpoint parameter values for a determined combination of values of the measurable quantities of the set of functional data.

This arrangement allows facilitating the interpretation of the reference data structure.

According to one implementation of the method of constitution, the setpoint parameter values for a determined combination of values of the measurable quantities of the set of functional data correspond to the setpoint values for at least one actuator.

According to one implementation of the method of constitution, the setpoint parameters for a determined combination of values of the measurable quantities of the functional data set are parameters of a function allowing determining setpoint values for at least one actuator.

According to one implementation of the method of constitution, the setpoint parameters for a determined combination of values of the measurable quantities of the set of functional data are parameters for selecting a scenario from among a plurality of predefined scenarios allowing determining setpoint values for at least one actuator.

The present invention also relates to a method of controlling at least one actuator of a building automation installation equipment, the method being implemented by the actuator or by a controller associated with said actuator, and comprising:
- a step of determining a combination of measured values of quantities measurable by at least one sensor associated with at least one actuator,
- a step of accessing a reference data structure comprising a set of associations between setpoint parameter values and predetermined values from the combinations of the values measurable by said at least one sensor,
- a step of selecting from the reference data structure at least one setpoint parameter value based on said combination of measured values,
- a step of controlling at least one actuator by applying a setpoint determined according to at least one setpoint parameter value selected from the reference data structure.

This arrangement avoids the electrical equipment of an installation, particularly the actuators, of having to calculate a setpoint based on values sent back by the associated sensors, only a choice in a reference data structure of a setpoint parameter value allowing applying a setpoint if needed, which considerably saves computing resources of these electrical equipment.

According to one implementation of the control method, the selection step consists in selecting a pixel in a digital data structure compatible with a representation in the form of an image comprising a set of pixels, each pixel being defined by a positioning and least one component,
the positioning of a pixel in the image being determined as a function of the measured values of quantities measurable by the sensors associated with at least one actuator and forming different combinations of values within a set of variables called functional data set, and
at least one component of a pixel of the image corresponding to the setpoint parameter values for a determined combination of values from the functional data set.

According to one implementation of the control method, the setpoint of at least one actuator is determined based on a selection of the setpoint parameter values contained in the selected pixel of the image.

According to one implementation of the control method, the setpoint of at least one actuator is determined based on a function of the setpoint parameter values contained in the selected pixel of the image.

According to one implementation of the control method, the setpoint of at least one actuator is determined based on a type of scenario selected from a plurality of predefined scenarios based on setpoint parameter values contained in the selected pixel of the image.

According to one implementation of the control method, the setpoint of at least one actuator is determined by taking into account setpoint parameter values contained in the selected pixel of the image and the value measured by a sensor.

According to one implementation of the constitution method or of the control method as described above in implementations, the positioning of a pixel is determined in a two-dimensional image whereof the first dimension represents a scale of values corresponding to a variable from the set of variables that is able to be measured by a sensor associated with at least one actuator, and whereof the second dimension represents a scale of values corresponding to another variable from the set of variables that are able to be measured by the sensor or another sensor associated with at least one actuator.

According to one implementation of one or the other of the methods of constitution or control, the first dimension corresponds to the date and the second dimension corresponds to time information.

According to one implementation of one or the other of the methods of constitution or control, the first dimension corresponds to time information in the year.

According to one implementation of one or the other of the methods of constitution or control, the first dimension corresponds to the elevation and the second variable corresponds to the azimuth.

According to one implementation of one or the other of the methods of constitution or control, the components of the pixels are represented according to a color scale.

According to one implementation of one or the other of the methods of constitution or control, the method comprises a step of displaying the image on a display device.

According to one implementation of one or the other of the methods of constitution or control, a plurality of data structures corresponding to images is encoded, the components of pixels of an image from among said plurality of images corresponding to the setpoint parameter values intended for at least one actuator among a plurality of actuators, the method further comprising:
- a step of comparing the images belonging to the plurality of images on the basis of the evaluation of at least one criterion of similarity, and
- a step of distributing images and/or actuators in groups according to the evaluation of at least one criterion of similarity. This arrangement allows controlling the electrical equipment of the installation by groups of elements.

According to one implementation of the method of constitution, the steps are implemented by a computer distinct from at least one actuator.

The present invention also relates to a computer comprising computing means designed to implement the steps of a method of constitution such as described above.

The present invention also relates to an actuator or a set comprising an actuator and a controller associated with the actuator comprising action means arranged for implementing the steps of a control method as described above.

The present invention also relates to a system comprising at least one actuator or set comprising an actuator and a controller associated with the actuator as described above and at least one computer such as described above.

This arrangement allows providing a scalable system which does not require on-site interventions for the update of the related electrical equipment.

In addition, this system takes into account the bioclimatic conditions (climate, weather), of the location and orientation of the building based on setpoints given by the user (safety, presence/absence, time slots).

Finally, the present invention relates to a method of controlling a building automation installation comprising at least one actuator, said method comprising:
- a step of generating a reference data structure comprising determined values of at least one setpoint parameter implemented by a computer,
- a step of transferring said reference data structure from the computer to at least one actuator, and
- a step of controlling at least one actuator by applying a determined setpoint according to the values of at least one setpoint parameter selected from the reference data structure, implemented by at least one actuator or a controller associated with an actuator (12).

According to one implementation of the control method, the selection of at least one setpoint parameter from the reference data structure is performed according to a combination of measured values of quantities measurable by sensors associated with at least one actuator.

According to one implementation of the control method, the computer implements a step of determining at least one value corresponding to at least one setpoint parameter for at least one determined combination of values of quantities measurable by at least one sensor associated with the actuator.

The present invention also relates to a computer program product intended to implement a method of constituting a reference data structure as described above.

The present invention also relates to a data medium comprising the instructions of said computer program product. The present invention also relates to such a computer program product installed on a computer.

The present invention also relates to a computer program product intended for implementing a control method as described above. The present invention also relates to a data medium comprising the instructions of said computer program product. The present invention also relates to such a computer program product installed on an actuator or controller associated with the actuator.

The present invention also relates to a data medium containing reference data structure as described above.

Anyway, the invention will be better understood from the following description, with reference to the accompanying schematic drawing representing, by way of non-limiting example, a computer, an actuator and a system implementing the steps of the methods according to the invention.

Figure 1:
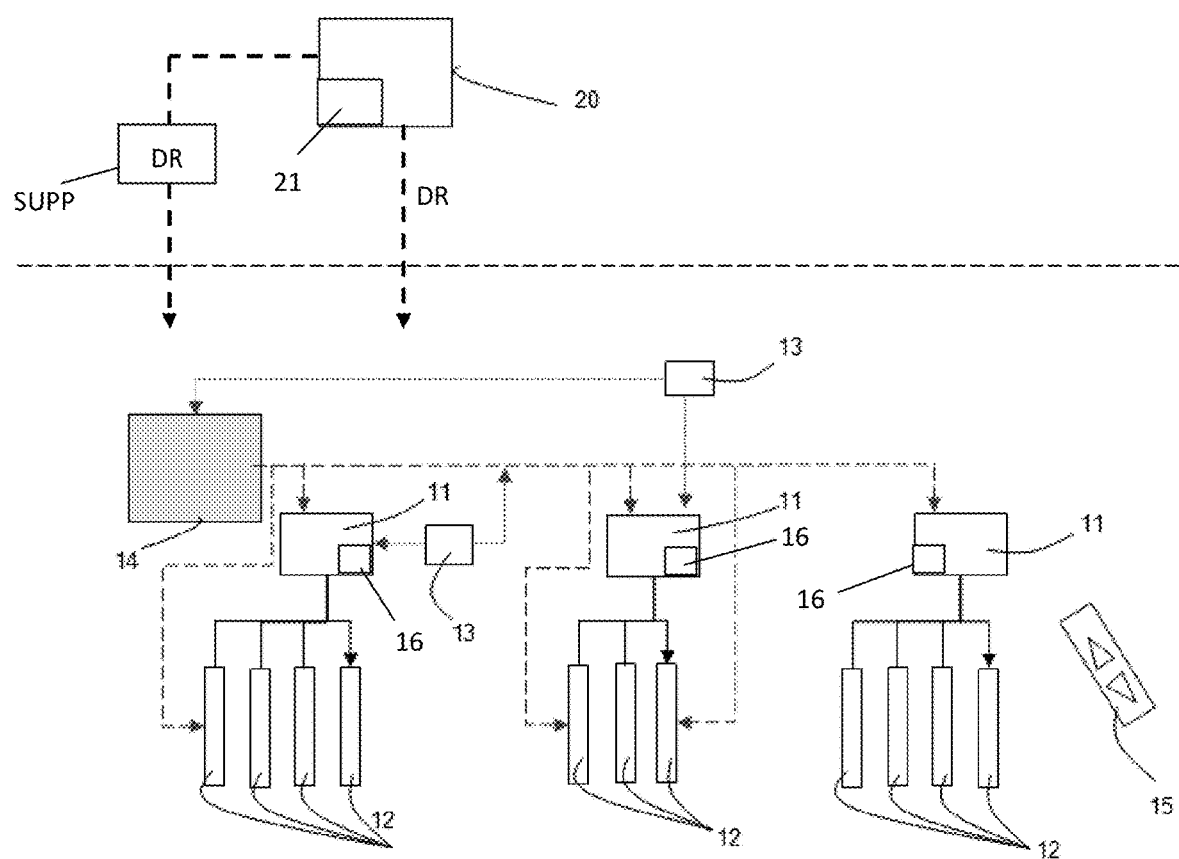
FIG. 1 is an overview diagram of a system according to the invention.

As shown in FIG. 1, system 1 according to the invention comprises at least one actuator 12 and at least one computer 20 also according to the invention.

In the shown example, the system comprises a plurality of actuators 12 that are part of an installation 10 of electrical equipment 10 and a computer 20 external to the installation 10, remote or not and distinct from the installation 10.

The computer 20 comprises calculation means 21 whereof function will be described later.

The installation 10 itself comprises the actuators 12 for controlling movable members of the building (blinds, roller blinds), as well as lighting, heating, ventilation and/or safety (alarms) equipment.

Furthermore, the installation 10 comprises controllers 11 driving one or several actuators 12, sensors 13 as well as controllers 14 of a building or an area of the building and local remote controls 15 available to users. What is meant by "controller associated with at least one actuator," is the controller or controllers 11 or the controller or controllers 14 of a building or an area of the building.

The sensors 13 send back to the actuators 12 or to their controllers 11, measured values of measurable quantities VE1 such as temperature, light, wind speed, the presence of rain, or even the presence of a user.

The actuators 12 may have access to information pertaining to them from the sensors 13, as well as means for measuring the weather which can also be assimilated to sensors 13. Within the meaning of the invention, the weather is a magnitude measurable by sensors 13.

The various actuators 12 or controllers of the actuator 11, 14 of the installation 10 act on setpoint parameters PAR of the controlled members, for example the travel and orientation of the external venetian blinds, the travel for the blinds, the status of the lighting/heating/ventilation equipment, etc. In a manner known per se these members can be in communication.

However, contrary to the systems of the state of the art, where the setpoint Cs is determined based on the setpoint parameters PAR calculated by each of the actuators 12 upon receiving information from the sensors 13 which are associated to them, the setpoint parameters PAR of each of the actuators 12 of the installation 10 of the system 1 according to the invention according to which a setpoint Cs is determined, are calculated in advance by the calculation means 21 of the computer 20.

These setpoint parameters PAR are gathered in a reference data structure DR which is then transferred to the actuators 12, which by means of their action means 16 use this reference data structure DR to determine the setpoint Cs to be applied to the relevant actuator 12.

Thus, the setpoint parameters PAR allow applying a setpoint Cs to a considered actuator 12, the reference data structure DR being able to be interpreted by means of action means 16 of each of the actuators 12.

In order to constitute the reference data structure DR, the computer 20 implements the steps of a first method according to the invention, called of constitution of said reference data structure, the latter comprising at least one setpoint parameter PAR of at least one actuator 12 of a building automation installation 10.

The method of constituting a reference data structure DR comprises a first step S10 of determining, according to a predefined rule, of a set E1 of at least one combination CVE1 of values VE1 of quantities measurable by at least one sensor 13 associated with the actuator 12, called set of functional data E1.

This step S10 consists in forming a set E1 comprising combinations CVE1 between the values VE1 of the measurable quantities, which can be theoretically measured by at least one sensor 13 associated with at least one actuator 12 of the installation 10.

Once this set of functional data E1 is determined, the computer 20 implements a step of determining, for at least one determined combination CVE1$j$ belonging to the set of functional data E1, of at least one value VPi corresponding to at least one setpoint parameter PAR.

At least one value VPi is determined based on the determined combination CVE1$j$ of the set of functional data E1.

These different combinations CVE1$j$ of values VE1 of the set of functional data E1 are hence each associated with values VPI corresponding to setpoint parameters PAR.

The computer 20 in a step S30 hence generates the reference data structure DR comprising a set of associations {CVE1$j$; VPi} between at least one determined value VPi corresponding to at least one setpoint parameter PAR and the determined combination CVE1$j$ belonging to the set of functional data E1.

This step amounts to using a predefined rule of association in the system 1 for associating at least one setpoint parameter PAR with a set of values of the quantities measurable by the sensors 13.

This predefined rule of association is known in advance by the computer 20 and by each concerned actuator 12 or related actuator controller 11, 14.

For each setpoint parameter PAR, the calculation is hence carried out in advance with respect to the implementation of the calculated parameters and with respect to the measurements carried out by the sensors 13.

This calculation takes into account a predetermined series CVE1$j$ of values VE1 of the quantities measurable by the sensors 13, the calculation being made for the combinations of the set. A combination of values CVE1 may correspond, for example, to a range of measurable values VE1 which generates a change in the calculated setpoint parameter PAR and/or a particular value from a limited number of possibilities, for example a value from a sensor of the presence/absence of an individual. In particular at a time of day and/or the day in the year, may be assimilated to a measurement of a measurable magnitude carried out by a sensor 13.

It is worth noting that the values VE1 are actually measured by the sensors 13 during the implementation of the setpoint parameters PAR with a view to applying a setpoint Cs for the considered actuator 12, however, at no point are these values VE1 sent to the computer 20.

In another embodiment, the calculation of the setpoint parameters PAR takes into account a set E2 of configuration data VE2 allowing the creation of complex models, particularly of the type usually referred to as "shadow management", including the bioclimatic data of the building, its environment and its orientation, as well as possible setpoints from the user, for example direct sunlight less than one meter behind a window, a day/night operating mode, a weekday/weekend operating mode, a manual mode authorization by a user, or even an operating status if an alarm is sounded.

Figure 2:
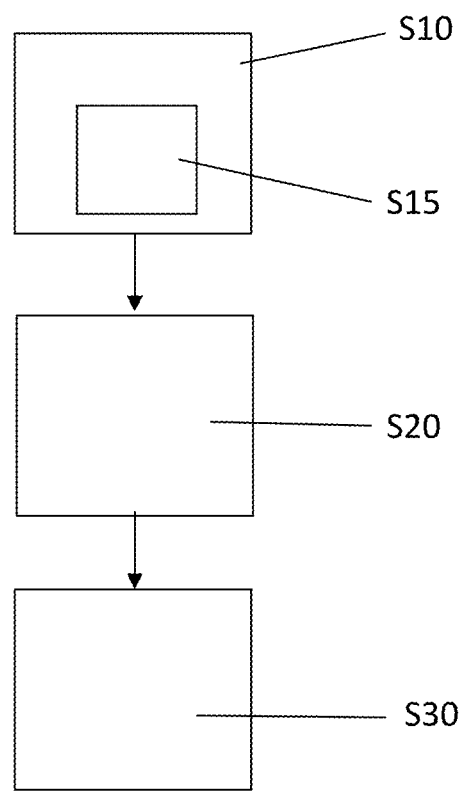
FIG. 2 is a diagram illustrating the steps of a method of constitution according to the invention.

As shown in FIG. 2, the method of constituting a reference data structure DR may further comprise a step S15 of determining a set E2 of configuration data VE2 for the building automation installation 10, the determination of at least one value VPi corresponding to at least one setpoint parameter PAR also being performed according to the configuration data VE2 of the set E2 of data configuration VE2 of the building automation installation 10.

This step S15 includes for example a step of modeling the building, particularly a three-dimensional modeling of the building and a modeling of the actuators 12, such as motorized shading screens on the different sides of the building.

The modeling may comprise a graphical construction or a simple identification, for example an identification of the related openings of the invention.

The use of specific software dedicated to the virtual representation of a three-dimensional shape is particularly suitable for this step.

In particular, the real dimensions and precise positioning of the openings intended to receive motorized screens must be respected during step S15.

Preferably, this modeling will be based on building plans of the building, or even on a modeling provided by the architect in charge of the construction of the building.

Tools for viewing the environment, for example of geoportal or Google Earth™ type may also be used as support for modeling the related building.

During this step S15, data pertaining to the geometry of the building as well as data pertaining to the geographical orientation and geographical position of the building are entered and retrieved.

Data relating to weather forecasts may also be taken into account during the implementation of the step S15.

Similarly, the surrounding structures are also modeled and possibly inserted on the same graphic interface as the modeling of the automated building.

The surrounding structures could be other buildings, geological or natural reliefs.

Particularly, in the case of natural reliefs, such as trees, an estimated change of the future dimension of these reliefs may also be integrated during the implementation of step S15.

During this step S15, therefore it is hence entered or retrieved data relating to the geometry of the surrounding structures as well as the data pertaining to the positions of the surrounding structures with respect to the building.

During step S15, it is also possible to not graphically model the building, but to provide the coordinates of the different points of the meshing to allow computing the presence of sun or shade for each meshing point of the building over time.

Then during this step S15, it is determined, for example iteratively, the shadows cast onto the building. This notion of iterative determination involves the fact of bringing to the screen and by time increments, data pertaining to the entire building.

The cast shadow may be, as explained above, the shadow cast by the building onto itself and/or by the surrounding structures, particularly the structures modeled during step S15.

In an alternative or complementary manner, the reflections on the building, caused by the surrounding structures may also be modeled, the reflections depending on the nature or color of the materials constituting the surrounding structures, particularly the facades of the surrounding structures. The iterative determination is performed by simulation of the travel of the sun over time, for example an assessment of the trajectories of rays of light, and by taking into account the impact of the structures found on the trajectories of the simulated sunrays. This iterative determination is carried out for a given geographical localization of the given building (latitude, longitude and orientation of facades), this information being provided for example during the modeling step S15 of the building.

The iterative determination may also be performed graphically with a representation of the shadows cast on the building over time.

This determination may take into account weather forecast data.

The calculation is implemented by calculation means of the computer 20, based on a software program which is specifically implemented for this step S15.

In fact, the software makes it possible to report at each represented opening, the determination of the presence or not of a shadow cast over time and save these data in a configuration file.

For example, the file may comprise a data structure including opening identifiers in rows and the different dates of the year in columns.

"Date" refers to an instant defined by a given hour of a given day of the year, for example 28 January 4:15 p.m.

By choosing a time step of 15 minutes, it is obtained 24×4×365=35040 dates in a year of 365 days. In this data structure it can be represented by a given value, for example "1", the presence of a shadow on a given date at a given opening.

It can be represented by a given value, for example "0", the absence of a shadow on a given date at a given opening.

The step S15 of determining a set E2 of configuration data VE2 of the building automation installation 10 may be renewed for a building over time if a change has been made on the building, such as for example a change in the structure or change in the installation or its environment requiring updating the data file.

This is for example the case if a new building is built in the vicinity of the related building. This is still the case, if the vegetation has grown in the vicinity of the related building.

The reference data structure DR may be digitally encoded based on an encoding/decoding rule during step S30 of generating the reference data structure DR.

This encoding/decoding rule is also predefined and known in advance by the computer 20 and by each actuator 12 related actuator controller 14.

The data of the reference data structure DR containing the setpoint parameters PAR encoded according to the encoding/decoding rule and associated with combinations CVE1$j$ according to the aforementioned rule of association are then transferred to the actuators 11, 12 of the building automation installation 10. The transfer may be carried as the data structure is generated. Alternatively, the data can be stored in a file. This file can be transmitted to the actuator 12 or related actuator controller 11, 14 or saved to a data medium SUPP available to each of the actuators 12 or actuator controllers 11, 14 of the installation 10.

In addition, the data transfer between the computer 20 and the installation 10 can be performed by the computer 20, or by another means.

According to a particular embodiment of the method of constitution, the digital encoding is compatible with a graphical representation in the form of an image I having a set of pixels Px.

In this case, the data transfer can be optimized if this image I is transferred in compressed form, for example without loss.

Figure 4:
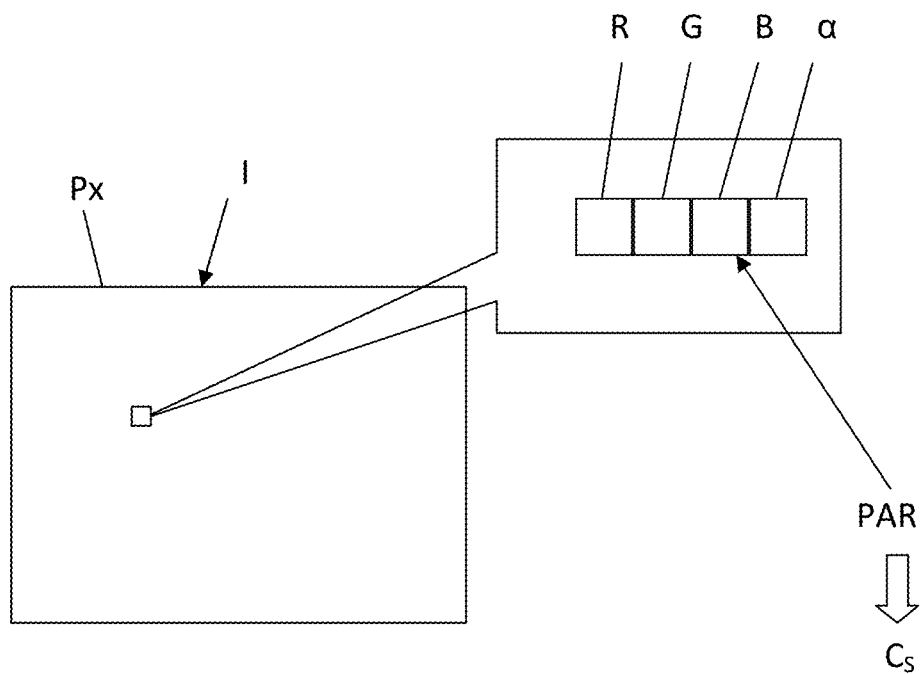
FIG. 4 shows the generation of a data structure encoded in digital form and comprising a set of pixels defining an image.

As shown in FIG. 4, each pixel Px of the image I is defined by a positioning and at least one component.

The positioning Pos of a pixel Px in the image I is determined as a function f of the different combinations CVE1 of values VE1 of the quantities measurable by the at least one sensor 13 associated with the related actuator.

As for at least one component of a pixel Px of at least one image I, it corresponds to the setpoint parameter values PAR for a determined combination CVE1 of values VE1 of the measurable quantities of the functional data set E1.

As mentioned above, the values VPi of the setpoint parameters PAR allow applying a setpoint Cs to a related actuator 12.

According to alternative embodiments of the method of constitution, these setpoint parameter values PAR correspond either to setpoint values Cs for at least one actuator 12, or to parameter values of a function allowing to determine setpoint values Cs for at least one actuator or to parameter values for selecting a scenario from a plurality of scenarios predefined and known by the related actuator 12 and allowing determining setpoint values for Cs for at least one actuator 12.

This is how the components of the pixels of a graphic representation in the form of an image I can directly send back to a setpoint Cs, or to another image whereof the components of the pixels would include the setpoint Cs to be applied by the actuator 12.

The reference data structure DR sent by the computer 20 or stored on the medium SUPP is used by an actuator 12 or actuator controller 11, 14 to control a building automation installation 10 equipment. To this end, the actuator 12 implements the steps of a second control method according to the invention.

Figure 3:
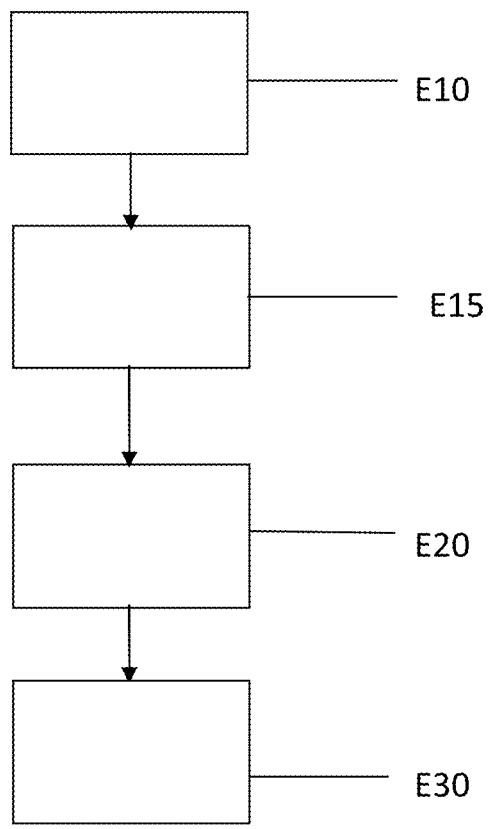
FIG. 3 is a diagram illustrating the steps of a control method according to the invention.

As shown in FIG. 3, the control method includes a first step E10 of determining a particular combination CVE1$j$ of measured values VE1 of quantities measurable by at least one sensor 13 associated with the actuator 12.

This step E10 consists in accessing the information from the sensors 13 associated with the actuator 12 and determining a particular combination CVE1 of values VE1 among which may be featured the time, for example a time of day and the date of the year or the day of the week or weekend. A combination of values CVE1 may correspond, for example, to a range of the measurable values VE1 generating a change in the calculated setpoint parameter PAR and/or a particular value from a limited number of possibilities, such as for example a value from a sensor of presence/absence of an individual.

In a second step the actuator performs an access to a reference data structure DR comprising a set of associations {CVE1$j$; VPi} between setpoint parameter values VPi and predetermined values of combinations CVE1$j$ of the values measurable by said at least one sensor 13.

In a third step E20, the actuator selects at least one setpoint parameter VPi value d, according to the particular combination CVE1$j$ determined during step E10.

To this end, the actuator 12 applies the predefined rule of association with which the computer 20 has constituted the reference data structure DR.

Finally, the actuator 12 applies the setpoint Cs corresponding to at least one value VPi of the setpoint parameters PAR selected during step E20.

The application of the setpoint Cs is performed after decoding the data according to the encoding/decoding rule with which the computer 20 has encoded the data in the reference data structure DR.

Thus, to determine the value VPi of the setpoint parameters PAR, an actuator 12 or actuator controller 11, 14' first determines a combination CVE1 of the quantities actually measured by the sensors 13, the time optionally being part of these measured values, and then selects from the reference data structure DR the value VPi of the setpoint parameters.

The actuators 12 or actuator controllers 11, 14 thus ensure a functioning taking into account complex models as the values of the setpoint parameters calculated by the computer 20 incorporate the bioclimatic modeling data, weather, etc. and ensure a near real-time operating whereof the reaction time results from the processing of the quantities measured by the sensors 13 and reading the values VPi of the setpoint parameters PAR on the reference data structure DR.

The actuators 12 or actuator controllers 11, 14 also ensure a scalable operating, without the need of on-site updating, the latter being performed on the computer 20, particularly during new calculations resulting from changes in the environment in which the installation 10 is installed and hence, the configuration data VE2 of the set E2.

It is worth noting that as long as the encoding/decoding rule and the rule of association used in the system do not change, the actuators can only modify their behavior after the generation of new reference data structure.

Thus, to generate new automatic operating rules, the computer 20 can generate new data and transmit them to the actuators 12 or actuator controllers 11, 14 to be driven.

Without a hardware or software update, the related actuator 12 or actuator controller 11, 14, changes behavior by simply reading new data from the reference data structure DR.

In case where the reference data structure DR is encoded in digital format compatible with a representation in the form of an image I, the step E20 of selecting a parameter value VPi according to the particular combination CVE1$j$ of values measured by the sensors 13, amounts to selecting a pixel Px in the image I constituting the reference data structure DR, as is shown in FIG. 4.

As for the method of constitution, the control method comprises alternatives in which the values of the setpoint parameters PAR correspond either to setpoint values Cs for at least one actuator 12, or parameter values of a function allowing determining setpoint parameters Cs for at least one actuator or parameter values for selecting a scenario selected from among a plurality of predefined scenarios allowing determining setpoint values Cs for at least one actuator 12.

For an encoding of type "choice of scenario" from among a plurality of predefined scenarios, the actuator 12 or actuator controller 11, 14 must have the pre-programmed scenarios, and the computer 20 can remotely change the selection criteria of the scenario to be used.

Thus, the components of the pixels of a graphic representation in the form of an image I may directly send back to a setpoint Cs, or to another image I whereof the components of the pixels Px would comprise the setpoint Cs to be applied by the actuator 12.

For the graphic representation in the form of an image I a data format of 4×8 bits is preferred as data represented in this manner can be represented in the form of an image I, in "RGB-α" type format.

In this case, in a representation in a two-dimensional image whereof the first dimension represents a scale of values corresponding to a variable of the set of variables VE1 able to be measured by a sensor 13 associated with at least one actuator 12, and whereof the second dimension represents a scale of values corresponding to another variable of the set of variables VE1 able to be measured by the sensor 13 or another sensor 13 associated with at least one actuator 12.

For example, in an x/y plane, it can be represented on the "x" axis the output values of a first sensor 13 (including the time), on the "y" axis the output values of a second sensor 13 (including the time), as well as a point of coordinates (xp, yp) in the form of a pixel (Rp, Gp, Bp, up).

The values Rp, Gp, Bp, up corresponding to the values VPi contain the sought setpoint parameters PAR.

These values may optionally comprise additional indications taking into account the output values of one or several sensors 13, measured during step E10 of determining a combination CVE1j of measured values of quantities measurable by sensors 13 associated with at least one actuator 12 of the control method.

Figure 5:
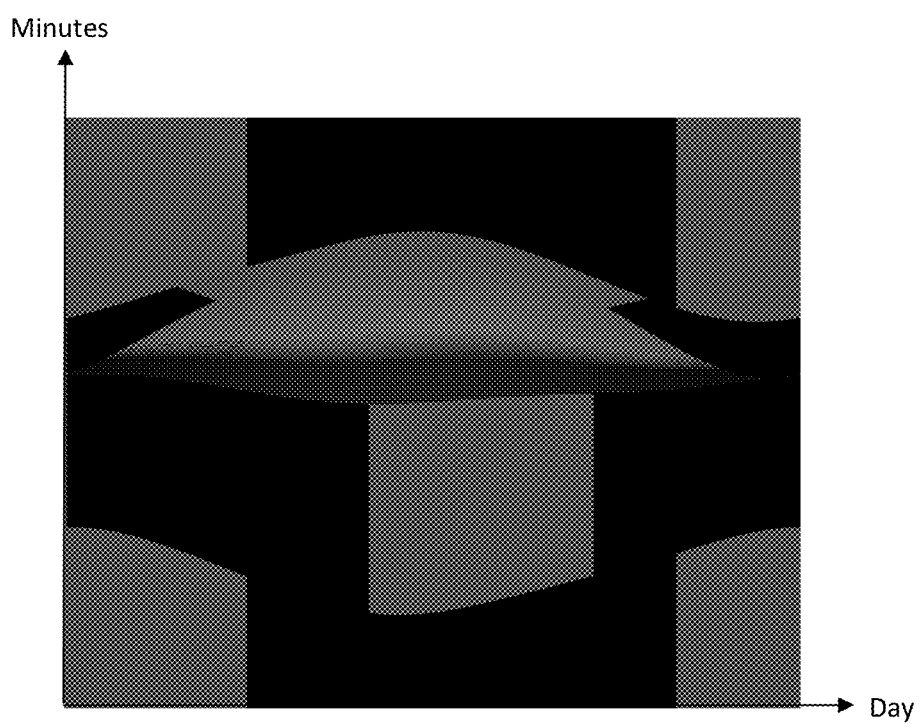
FIG. 5 shows a first example of a representation in the form of an image of a reference data structure.

In the example shown in FIG. 5, the relevant electrical equipment is a movable equipment of venetian blind type, the setpoint parameters PAR of which are the travel (between two predefined min/max values) and the orientation of the slats.

In a graphical representation in the form of an image I, the "x" axis represents the day in the year or date and the "y" axis represents the minute in the day, which constitutes time information.

A pixel Px of the image I corresponding to a coordinate point "x, y" and represented in image color format "RGB-α" may thus include the following encoding:

encoding "R" corresponding to bits 31 to 24 and defining the position in percentage of the travel of the slats in the case where an additional sensor 13 measures a magnitude sending back a value according to which the user is absent, encoding "G" corresponding to bits 23 to 16 and defining the position in percentage of the orientation of the slats in the case where an additional sensor 13 measures a quantities sending back a value according to which the user is absent, encoding "B" corresponding to bits 15 to 8 and defining the position in percentage of the travel of the slats in the case where an additional sensor 13 measures a magnitude sending back a value according to which the user is present, encoding "α" corresponding to bits 7 to 0 and defining the position in percentage of the orientation of the slats in the case where an additional sensor 13 measures a magnitude sending back a value according to which the user is present.

Thus, the predefined rule of association indicates the data to be read, according to the status of the two sensors 13 assigned to the two dimensions of the image I, in this instance in the example introduced these two sensors both send back time values.

The relevant encoding rule however, indicates two sets of setpoint parameters, the travel of the movable element: the choice between the two sets of setpoint parameters will be made based on the output of the additional sensor 13 informing of the presence or absence of a user.

Figure 6:
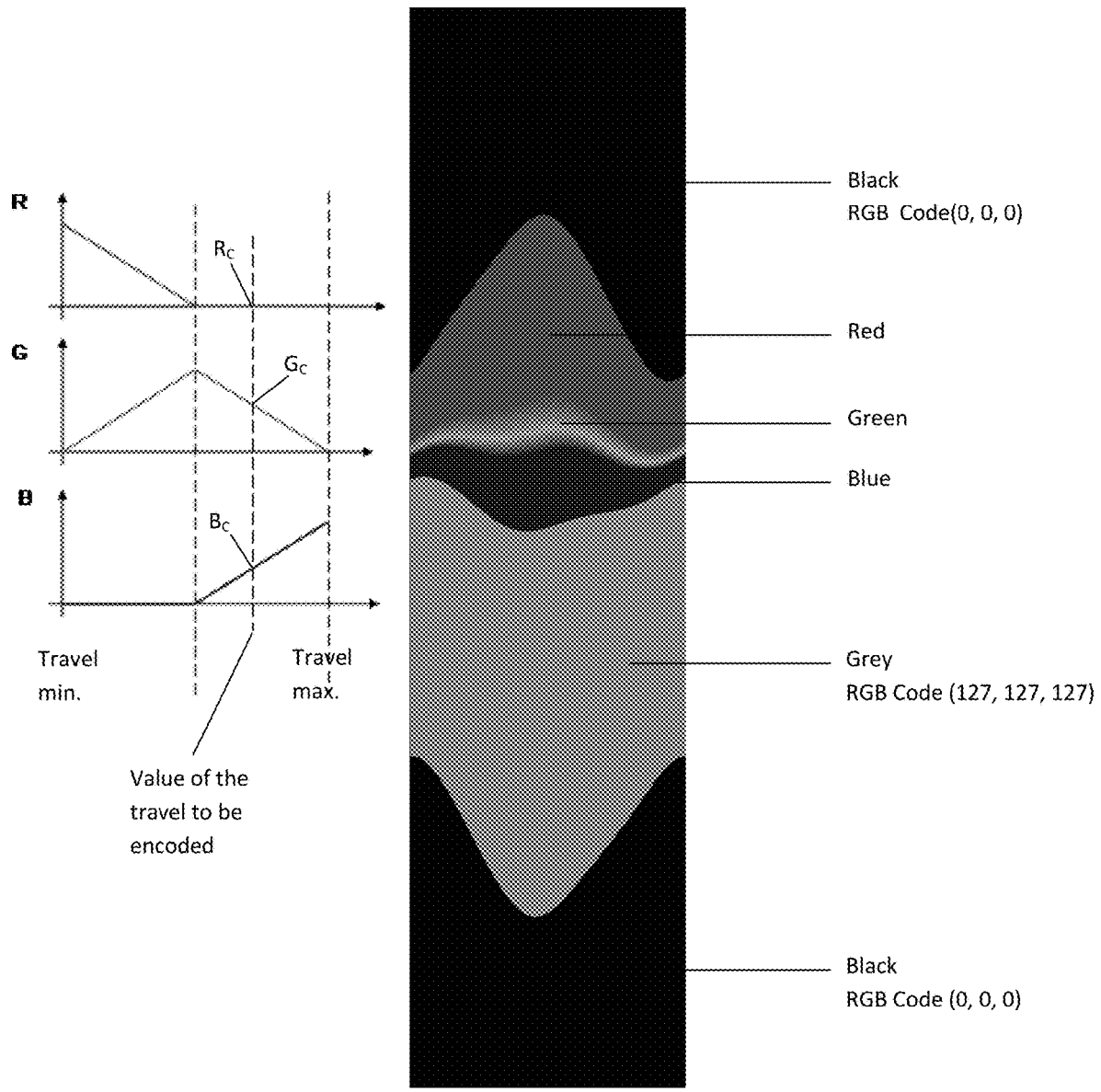
FIG. 6 shows a second example of a representation in the form of an image of a reference data structure.

In another example represented in FIG. 6, the relevant electrical equipment is a movable equipment of roller blind type, its setpoint parameter PAR is the travel (between two predefined min/max values).

In a graphical representation in the form of an image I, the "x" axis represents the day in the year or date and the "y" axis represents the minute in the day, thus constituting time information.

A pixel Px of the image I corresponds to a coordinate point "x, y" and may be represented in color image format "RGB"

The computer 20 determines in advance if a direct energy is present or not, according to the configuration data VE2 of the set E2, particularly bioclimatic data related to the environment and orientation of the building, but also the position of the window in the building.

Then, the travel of the blind is calculated, for example, with the setpoint of not letting the sun penetrate the building beyond one meter.

The encoding rule changes, according to the presence of a direct energy on the relevant window, which can be detected by an additional sensor 13, and time.

If a direct energy is liable to be present on the window, then the value of the travel is represented according to a predetermined scale of colors RGB otherwise if the variable y corresponding to daytime hours but that the window is in the shade then a first default value, for example with a RGB code (127, 127,127) will be used for the travel and the manual control is allowed (shown in grey in FIG. 6).

If under the same conditions, the variable y corresponding to nighttime hours, then a second default value, for example with an RGB code (0, 0, 0) will be used for the travel and manual control is not allowed (shown in black in FIG. 6).

It is worth noting that as the graph adjoined to the image in FIG. 6 shows, in this case only one value (travel C) is to be encoded, but three values are used (Rc, Gc, Bc). All possible encoding values are not used in order to privilege the visual effect on the human eye and possibly allow the application of known image processing methods.

Figure 7:
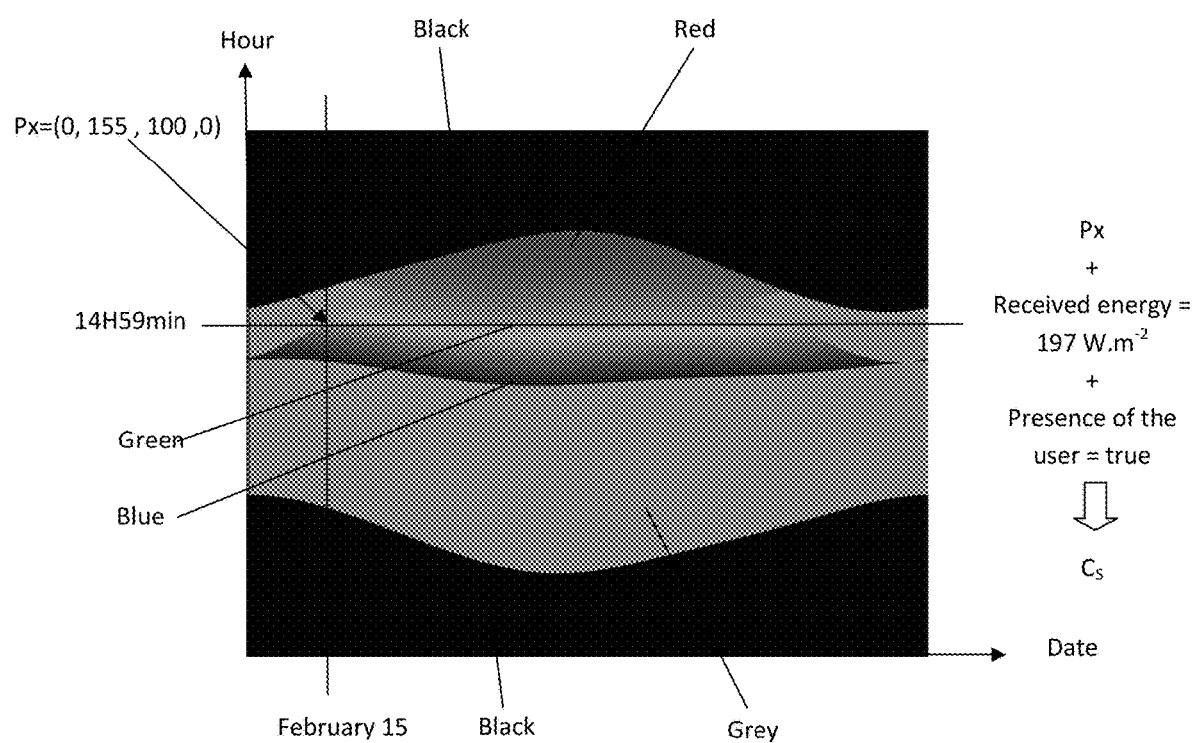
FIG. 7 shows a third example of a representation in the form of an image of a reference data structure.

In another example shown in FIG. 7, the relevant electrical equipment is a movable equipment of rollable blind or roller blind type, the respective setpoint parameters PAR are the same as in the previous examples.

In a graphic representation in the form of an image I, the "x" axis represents the day of the year or date, and the "y" axis represents the minute in the day which constitutes a time information.

A pixel Px of the image I corresponds to a coordinate point "x, y" and represents in color image format "RGB" the direct maximum incident energy that that relevant window may receive at this given moment.

The window has access to a sensor 13 indicating the quantity of energy actually received.

The actuator 12 or actuator controller 11, 14 may determine, for example by using an internal table, which are the setpoint parameters PAR.

Alternatively, it can determine the ratio of the received energy W and the maximum energy that it could receive at a given moment, and then determine its setpoint parameters PAR.

Figure 8:
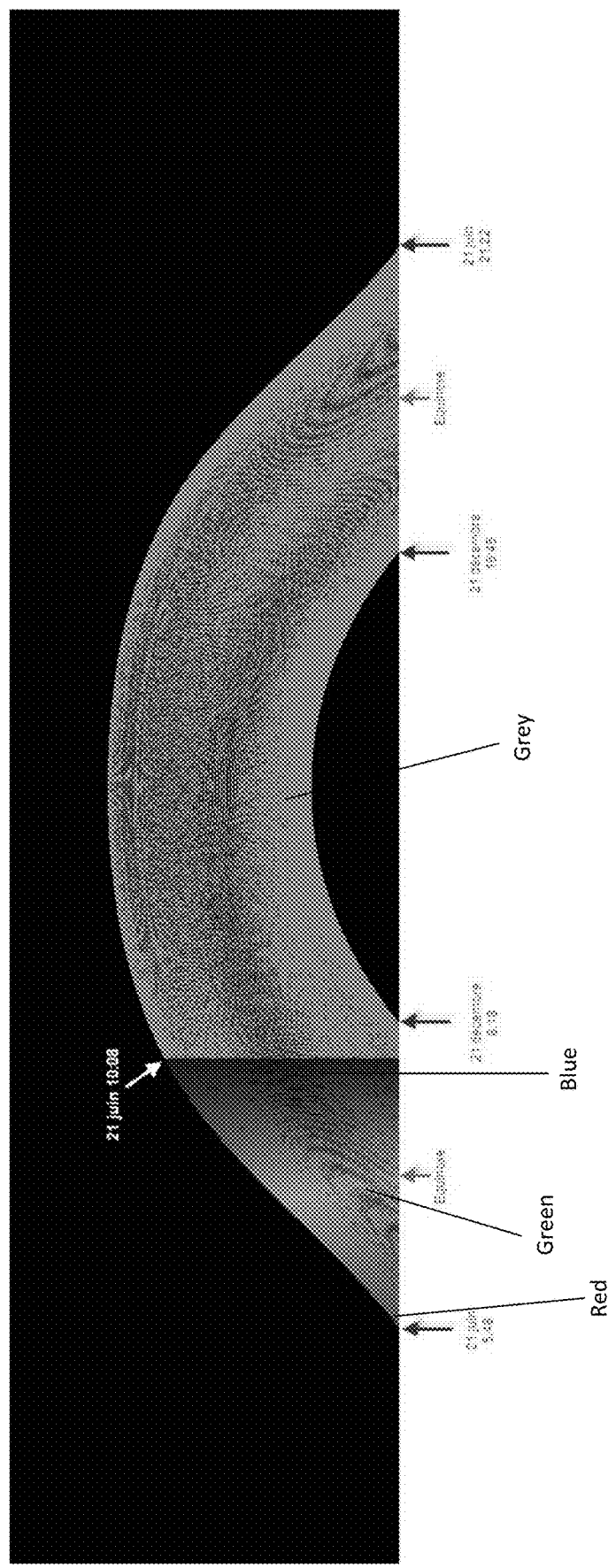
FIG. 8 shows a fourth example of a representation in the form of an image of a reference data structure.

In another example represented in FIG. 8, the relevant electrical equipment is a movable device of rollable blind or roller blind type, the respective setpoint parameters PAR are the same as in the previous example.

In a graphic representation in the form of an image I, the "x" axis represents the azimuth, and the "y" axis represents the elevation and a coordinate point "x, y" represented in color image format "RGB" the direct maximum incident energy that the relevant window can receive.

This example constitutes an alternative of the previous example.

These three examples use an encoded representation according to an "RGB color scale".

Such a representation allows at the same time optimizing the perception by the eye, and automatic processing, by image processing, for several applications, particularly for:
an analysis and a choice of the type(s), of shading, and
a definition of groups of actuators 12.

In fact, according to one alternative embodiment, the method of constitution or control includes a step of comparing images I belonging to the plurality of images I on the basis of the evaluation of at least one criterion of similarity CrS between images I of the plurality of images I, and a step of distributing images I and/or actuators 12 in groups Gr according to the evaluation of at least one criterion of similarity CrS.

A group is a hence a set of electrical equipment, for example of windows, having the same behavior in a same area of the building.

A controller 11, 14 can manage in an optimized manner a group Gr of electrical equipment of a same area of the building.

Thus, following the definition of a group Gr or area, the controller 11, 14 can receive only once the image I to be used to determine the setpoint of the actuators 12 of the group Gr making up the area.

The present invention also relates to a method of controlling a building automation installation 10 comprising at least one actuator 12, said method comprising a step S30 for generating a reference data structure DR including determined values VPi of at least one setpoint parameter PAR implemented by a computer 20.

This step may be identical to the step S30 of the aforementioned method of constitution, particularly in an implementation of the control method, the computer 20 having previously implemented a step S20 of determining at least one value VPi corresponding to at least one setpoint parameter PAR, for at least one determined combination CVE1$j$ of values VE1 of quantities measurable by at least one sensor 13 associated with the actuator 12.

Furthermore, the control method includes a step of transferring said reference data structure DR from the computer 20 to at least one actuator 12.

This transfer may be carried out by any means allowing a data transfer, the data being able to be encoded, for example in the form of an image or not.

Finally, the control method includes a step E30 of controlling at least one actuator 12 by applying a setpoint Cs determined according to the values of at least one setpoint parameter PAR selected from the reference data structure DR, implemented by at least one actuator 12.

This step may be identical to step E30 of the aforementioned control method, particularly in an implementation of the control method, the selection of at least one setpoint parameter PAR from the reference data structure DR is achieved according to a combination CVE1$j$ of measured values VE1 of quantities measurable by sensors 13 associated with at least one actuator 12.

Although the invention has been described in connection with particular embodiments, it is obvious that it is in no way limited thereto and includes all the technical equivalents of the steps of the method and the means described as well as their combinations.

The invention claimed is:

1. A method of setting a building automation installation comprising at least one actuator, the method being implemented by a computer being distinct from said at least one actuator, and comprising:
   a step of determining a set of at least one combination of values of quantities measurable by at least one sensor associated with the actuator, called set of functional data;
   a step of determining, for at least one determined combination belonging to the set of functional data, at least one value corresponding to at least one setpoint parameter, according to the determined combination,
   a step of generating a reference data structure comprising a set of association between at least one determined value corresponding to at least one setpoint parameter and the determined combination belonging to the set of functional data, and
   a step of transferring the reference data structure to said at least one actuator,
   wherein the step of generating comprises a sub step of digitally encoding the reference data structure, compatible with a representation in the form of an image comprising a set of pixels, each pixel of the image being defined by a positioning and at least one component,
   the positioning of a pixel in the image being determined as a function of the values of measurable quantities in said different combinations of the set of functional data, and
   at least one component of a pixel of at least one image corresponding to the setpoint parameter values for a determined combination of values of the measurable quantities of the set of functional data,
   wherein a plurality of data structures corresponding to images is encoded, the components of pixels of an image from among said plurality of images corresponding to the setpoint parameter values intended for at least one actuator among a plurality of actuators, the method further comprising:
   a step of comparing the images belonging to the plurality of images based on the evaluation of at least one criterion of similarity; and
   a step of distributing actuators in groups according to said step of comparing the images according to an evaluation of the criterion of similarity between images of the plurality of images;
   wherein a group is a set of electrical equipment having the same behavior in a same area of the building, and
   wherein the positioning of a pixel is determined in a two-dimensional image whereof the first dimension represents a scale of values corresponding to a variable from the set of variables able to be measured by a sensor associated with at least one actuator, and whereof the second dimension represents a scale of values corresponding to another variable from the set of variables able to be measured by the sensor or another sensor associated with at least one actuator;
   wherein the actuator applies a predefined rule of association with which the computer has constituted the reference data structure for selecting the values of at least one setpoint parameter;

wherein the predefined rule of association indicates the data to be read, according to a status of two sensors assigned to two dimensions of the image.

2. The method according to claim 1, further comprising a step of determining a set of configuration data of the building automation installation, and wherein determining at least one value corresponding to at least one setpoint parameter, is also performed based on the configuration data of the set of configuration data of the building automation installation.

3. The method according to claim 1, wherein the setpoint parameter values for a determined combination of values of the measurable quantities of the set of functional data correspond to setpoint values for at least one actuator.

4. The method according to claim 1, wherein the setpoint parameter values for a determined combination of values of the measurable quantities of the set of functional data are parameters of a function allowing determining setpoint values for at least one actuator.

5. The method according to claim 1, wherein the setpoint parameters for a determined combination of values of the measurable quantities of the set of functional data are parameters for selecting a scenario from among a plurality of predefined scenarios allowing determining setpoint values for at least one actuator.

6. The method according to claim 1, wherein the components of the pixels are represented according to a color scale.

7. The method according to claim 1, comprising a step of displaying the image on a display device.

8. The method according to claim 1, wherein:
the first dimension corresponds to the date and the second dimension corresponds to time information, wherein the first dimension corresponds to a time information in the year and the second dimension corresponds to the minute of the day, or
the first dimension corresponds to the elevation and the second variable corresponds to the azimuth.

9. A method of controlling at least one actuator of a building automation installation equipment, the method being implemented by the actuator or by a controller associated with said actuator, and comprising:
a step of transferring a reference data structure from a computer being distinct from said at least one actuator to said at least one actuator,
a step of determining a combination of measured values of quantities measurable by at least one sensor associated with at least one actuator,
a step of accessing the reference data structure comprising a set of associations between setpoint parameter values and predetermined values from the combinations of the values measurable by said at least one sensor,
a step of selecting from the reference data structure at least one setpoint parameter value based on said combination of measured values, wherein the actuator or controller applies a predefined rule of association with which the computer has constituted the reference data structure for selecting the setpoint parameter values,
a step of controlling at least one actuator by applying a determined setpoint according to at least one setpoint parameter value selected from the reference data structure,
wherein the selection step consists in selecting a pixel in a digital data structure compatible with a representation in the form of an image comprising a set of pixels, each pixel being defined by a positioning and at least one component,
the positioning of a pixel in the image being determined as a function of the measured values of quantities measurable by the sensors associated with at least one actuator and forming different combinations of values within a set of variables called functional data set, and
at least one component of a pixel of the image corresponding to the setpoint parameter values for a determined combination of values from the functional data set,
wherein the positioning of a pixel is determined in a two-dimensional image whereof the first dimension represents a scale of values corresponding to a variable from the set of variables able to be measured by a sensor associated with at least one actuator, and whereof the second dimension represents a scale of values corresponding to another variable from the set of variables able to be measured by the sensor or another sensor associated with at least one actuator,
wherein the predefined rule of association indicates the data to be read, according to a status of the two sensors assigned to the two dimensions of the image.

10. The method according to claim 9, wherein the setpoint of at least one actuator is determined based on a selection of the setpoint parameter values contained in the selected pixel of the image.

11. The method according to claim 9, wherein the setpoint of at least one actuator is determined based on a function of the setpoint parameter values contained in the selected pixel in a digital data structure compatible with a representation in the form of an image comprising a set of pixels.

12. The method according to claim 9, wherein the setpoint of at least one actuator is determined based on a type of scenario selected from a plurality of predefined scenarios based on setpoint parameter values contained in the selected pixel in a digital data structure compatible with a representation in the form of an image comprising a set of pixels.

13. The method according to claim 9, wherein the setpoint of at least one actuator is determined by taking into account setpoint parameter values contained in the selected pixel in a digital data structure compatible with a representation in the form of an image comprising a set of pixels and the value measured by a sensor.

14. A method of setting a building automation installation comprising at least an equipment and at least one actuator of said equipment, the method being implemented by a computer being distinct from said at least one actuator, and comprising:
a step of determining a set of at least one combination of values of quantities measurable by at least one sensor associated with the actuator, called set of functional data;
a step of determining, for at least one determined combination belonging to the set of functional data, at least one value corresponding to at least one setpoint parameter, according to the determined combination,
a step of generating a reference data structure comprising a set of association between at least one determined value corresponding to at least one setpoint parameter and the determined combination belonging to the set of functional data,
wherein the step of generating comprises a sub step of digitally encoding the reference data structure, compatible with a representation in the form of an image comprising a set of pixels, each pixel of the image being defined by a positioning and at least one component, the positioning of a pixel in the image being determined as a function of the values of measurable quantities in said different combinations of the set of functional data, and at least one component of a pixel of at least one image corresponding to the setpoint parameter values for a determined combination of values of the measurable quantities of the set of functional data, wherein a plurality of data structures corresponding to images is encoded, the components of pixels of an image from among said plurality of images corresponding to the setpoint parameter values intended for at least one actuator among a plurality of actuators, the method further comprising:

a step of comparing the images belonging to the plurality of images based on the evaluation of at least one criterion of similarity, and a step of distributing actuators in groups according to said step of comparing the images according to an evaluation of the criterion of similarity between images of the plurality of images wherein a group is a set of electrical equipment having the same behavior in a same area of the building;

wherein the positioning of a pixel is determined in a two-dimensional image whereof the first dimension represents a scale of values corresponding to a variable from the set of variables able to be measured by a sensor associated with at least one actuator, and whereof the second dimension represents a scale of values corresponding to another variable from the set of variables able to be measured by the sensor or another sensor associated with at least one actuator;

wherein the actuator applies a predefined rule of association with which the computer has constituted the reference data structure for selecting the values of at least one setpoint parameter;

wherein the predefined rule of association indicates the data to be read, according to a status of two sensors assigned to two dimensions of the image.

15. The method according to claim 14, wherein the selection of at least one setpoint parameter from the reference data structure is performed according to a combination of measured values of quantities measurable by sensors associated with at least one actuator.

16. The method according to claim 14, wherein the computer implements a step of determining at least one value corresponding to at least one setpoint parameter for at least one determined combination of values of quantities measurable by at least one sensor associated with the actuator.

17. A method of controlling a building automation installation comprising at least one actuator, said method comprising:

a step of generating a reference data structure comprising determined values of at least one setpoint parameter implemented by a computer, a step of transferring said reference data structure from the computer to at least one actuator, and a step of controlling at least one actuator by applying a setpoint determined according to the values of at least one setpoint parameter selected from the reference data structure, implemented by at least one actuator or a controller associated with an actuator, wherein the actuator or controller applies a predefined rule of association with which the computer has constituted the reference data structure for selecting the values of at least one setpoint parameter, wherein the step of generating comprises a sub step of digitally encoding the reference data structure, compatible with a representation in the form of an image comprising a set of pixels, each pixel of the image being defined by a positioning and at least one component, the positioning of a pixel in the image being determined as a function of the values of measurable quantities in said different combinations of the set of functional data, and at least one component of a pixel of at least one image corresponding to the setpoint parameter values for a determined combination of values of the measurable quantities of the set of functional data, wherein the positioning of a pixel is determined in a two-dimensional image whereof the first dimension represents a scale of values corresponding to a variable from the set of variables able to be measured by a sensor associated with at least one actuator, and whereof the second dimension represents a scale of values corresponding to another variable from the set of variables able to be measured by the sensor or another sensor associated with at least one actuator, wherein the predefined rule of association indicates the data to be read, according to a status of the two sensors assigned to the two dimensions of the image.

* * * * *